US010814496B2

(12) United States Patent
Bibl et al.

(10) Patent No.: US 10,814,496 B2
(45) Date of Patent: Oct. 27, 2020

(54) APPARATUS AND METHOD FOR ACTIVE SHAPE CONTROL OF A MICRO PICK UP ARRAY

(71) Applicant: Apple Inc., Cupertino, CA (US)

(72) Inventors: Andreas Bibl, Los Altos, CA (US); Paul A. Parks, Austin, TX (US); Stephen P. Bathurst, Lafayette, CA (US); Jon A. Williams, San Francisco, CA (US); John A. Higginson, Santa Clara, CA (US); Shenshen Zhao, San Jose, CA (US)

( * ) Notice: Subject to any disclaimer, the term of this patent is extended or adjusted under 35 U.S.C. 154(b) by 216 days.

(21) Appl. No.: 15/839,691

(22) Filed: Dec. 12, 2017

(65) Prior Publication Data

US 2018/0194014 A1    Jul. 12, 2018

Related U.S. Application Data

(60) Provisional application No. 62/444,695, filed on Jan. 10, 2017.

(51) Int. Cl.

| | |
|---|---|
| *B25J 15/00* | (2006.01) |
| *H01L 21/677* | (2006.01) |
| *H01L 21/683* | (2006.01) |
| *H01L 21/67* | (2006.01) |
| *H01L 21/68* | (2006.01) |
| *B25J 7/00* | (2006.01) |
| *B25J 15/04* | (2006.01) |

(52) U.S. Cl.
CPC ............ *B25J 15/0085* (2013.01); *B25J 7/00* (2013.01); *B25J 15/0033* (2013.01); *B25J 15/0052* (2013.01); *B25J 15/0408* (2013.01); *H01L 21/67144* (2013.01); *H01L 21/67288* (2013.01); *H01L 21/67721* (2013.01); *H01L 21/68* (2013.01); *H01L 21/683* (2013.01)

(58) Field of Classification Search
CPC ...... B25J 15/0085; B25J 15/0408; B25J 7/00; B25J 15/0033; B25J 15/0052; H01L 21/67288; H01L 21/68; H01L 21/67144; H01L 21/683; H01L 21/67721
See application file for complete search history.

(56) References Cited

U.S. PATENT DOCUMENTS

| | | | |
|---|---|---|---|
| 6,203,968 B1 * | 3/2001 | Igarashi | G11B 7/261 369/111 |
| 9,308,649 B2 | 4/2016 | Golda et al. | |
| 2007/0014920 A1 * | 1/2007 | Syms | B82Y 10/00 427/256 |
| 2013/0139713 A1 | 6/2013 | Cho et al. | |
| 2014/0071580 A1 * | 3/2014 | Higginson | B81C 99/002 361/234 |
| 2014/0241843 A1 * | 8/2014 | Golda | B25J 15/0085 414/751.1 |

(Continued)

*Primary Examiner* — Ziaul Karim
(74) *Attorney, Agent, or Firm* — Jaffery Watson Mendonsa & Hamilton LLP

(57) ABSTRACT

Structures and methods to actively control the shape of a micro pickup array (MPA) during micro device transfer are described. In an embodiment, a strain is applied to the MPA counteractive to strain arising during micro device transfer operations. For example, strain may be applied by a piezo-electric actuator element bonded to a back side of the base substrate to control a curvature of base substrate, and by extension the MPA.

20 Claims, 14 Drawing Sheets

(56) References Cited

U.S. PATENT DOCUMENTS

2014/0241844 A1* 8/2014 Golda .................. B25J 11/00
                                                    414/751.1
2014/0319381 A1* 10/2014 Gross .................. G06F 3/044
                                                    250/492.1
2015/0321338 A1* 11/2015 Parks .................... B25J 7/00
                                                    414/800
2016/0293566 A1* 10/2016 Golda .................. H01L 24/97

* cited by examiner

ZERO (FLAT) MPA CURVATURE

POSITIVE MPA CURVATURE

NEGATIVE MPA CURVATURE

APPARATUS AND METHOD FOR ACTIVE SHAPE CONTROL OF A MICRO PICK UP ARRAY

RELATED APPLICATIONS

This application claims the benefit of priority of U.S. Provisional Application No. 62/444,695 filed Jan. 10, 2017 which is incorporated herein by reference.

BACKGROUND

Field

Embodiments described herein relate to the transfer of micro devices. More particularly, embodiments relate to an apparatus and methods for actively controlling the shape of a micro pick up array during micro device transfer.

Background Information

Integration and packaging issues are one of the main obstacles for the commercialization of micro devices such as radio frequency (RF) microelectromechanical systems (MEMS) microswitches, light-emitting diodes (LEDs), and MEMS or quartz-based oscillators.

Traditional technologies for transferring of devices such as "direct printing" and "transfer printing" include transfer by wafer bonding from a transfer wafer to a receiving wafer. In both traditional and variations of the direct printing and transfer printing technologies, the transfer wafer is de-bonded from a device after bonding the device to the receiving wafer. In addition, the entire transfer wafer with the array of devices is involved in the transfer process.

In one process variation a transfer tool including an array of electrostatic transfer heads is used to pick up and transfer an array of micro devices from a carrier (donor) substrate to a receiving substrate. In such an implementation, the transfer heads operate in accordance with principles of electrostatic grippers, using the attraction of opposite charges to pick up the micro devices.

SUMMARY

In micro device transfer, a micro pickup array (MPA) may be electrostatically clamped to a support substrate. In an embodiment, the support substrate may be considered as a MEMS support substrate, in that the support substrate may be designed to support one or more MEMS devices, such as an electrostatic transfer head or micro electrostatic assembly (MESA). The combined micro pickup array and support substrate structure will have a particular shape at a given set of external loading and thermal conditions. For example, the spatial relationship among the micro electrostatic assemblies (MESAs), also referred to as electrostatic transfer heads, on the MPA may be such that the contact surfaces of the MESAs are substantially coplanar to each other under a set of conditions. Alternatively, the shape of the combined MPA and support substrate may be such that the contact surface of the array of MESAs fit onto a substantially non-planar surface curvature, for example, a spherical surface having a radius of curvature. During the transfer process, external conditions may vary, inducing changes in the curvature of the combined MPA and support substrate. For example, during micro device transfer, the temperature of the MPA/support substrate may be elevated relative to the target substrate (e.g. donor substrate or receiving substrate), resulting in a temperature differential. This temperature differential can cause a thermal gradient through the thickness of the MPA and support substrate, inducing strain and resulting in out-of-plane bending of the MPA. Changes in the shape of the MPA will correspondingly change the spatial relationship among the MESAs on the MPA. Because the MESAs form the interface the between MPA and target substrate during micro device transfer, changes in shape in the MPA will result in a positionally-dependent change the in spatial relationship between the array of MESAs and target substrate. Under such conditions the MPA/substrate interface may not be substantially flat, resulting in variations in contact pressure between individual MESAs and target substrate or with the result that individual MESAs may not contact at all. In an embodiment, a piezoelectric actuator element bonded to the support substrate platform can form a type of monomorph bending structure. Such an apparatus may induce a strain counter to any externally-induced strain in the MPA/support substrate structure, maintaining a shape. The resulting shape of the support substrate can be measured, and this information can be used in a feedback control loop to maintain the shape of the MPA to a reference. Embodiments describe structures and methods for controlling the curvature of the MPA contact surface.

DETAILED DESCRIPTION

Figure 1:
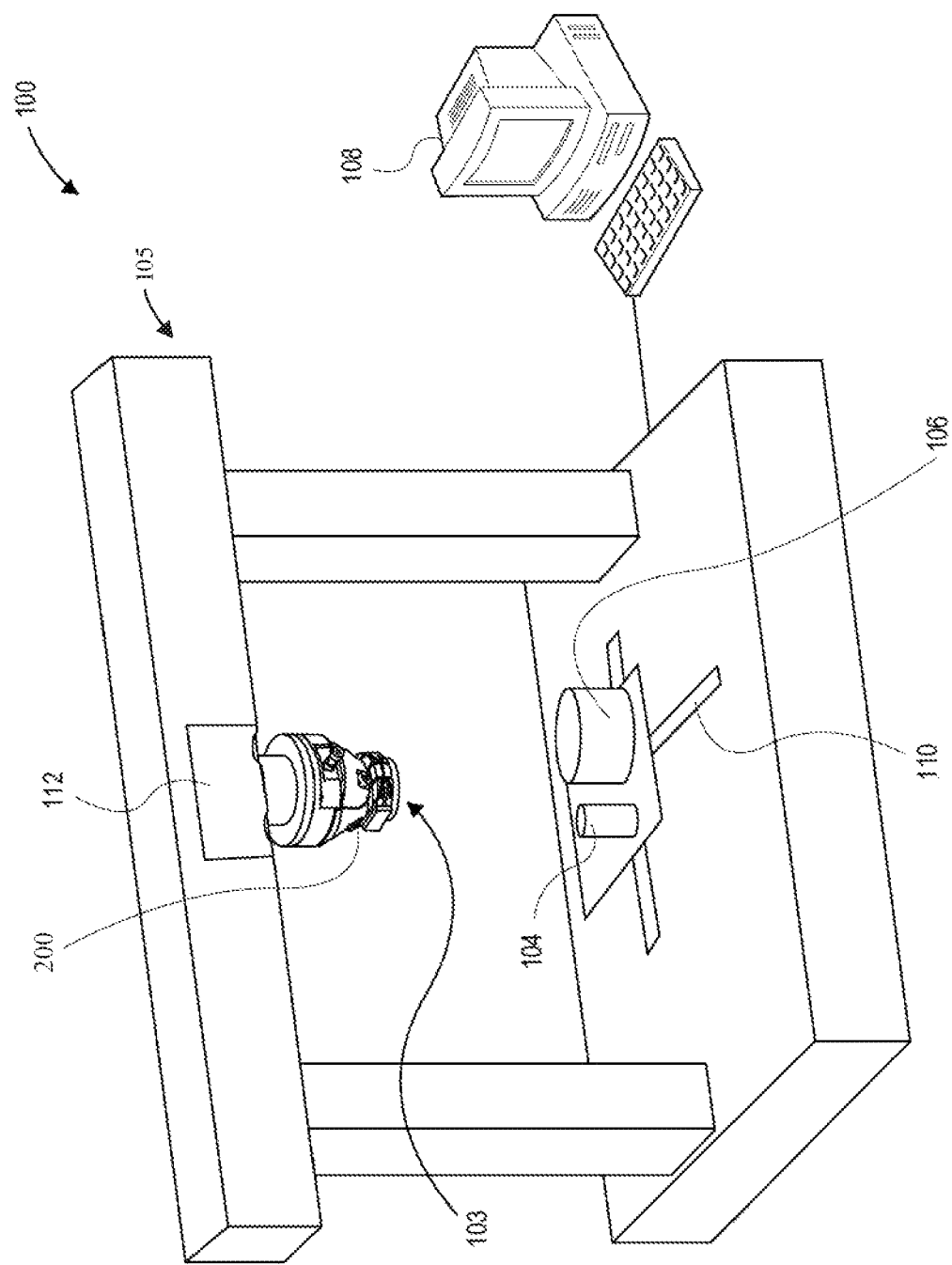
FIG. 1 is perspective view illustration of a mass transfer system in accordance with an embodiment.

In one aspect, embodiments describe structures and methods to actively control the shape of a micro pickup array (MPA) during micro device transfer by applying a strain counteractive to strain arising during micro device transfer operations. In accordance with embodiments, micro device transfer may generally require that the interface between the MPA and target substrate be substantially flat and parallel. For example, micro devices being transferred may be only a few microns thick. If the spatial relationship among the individual micro electrostatic assemblies (MESAs), also referred to a electrostatic transfer heads, across the array is not coplanar within a dimension smaller than the micro device thickness, the micro devices may not make contact with their respective MESA or the contact pressure between each micro device and its respective MESA may not be uniform across the array. Failure to make contact between a MESA and its target micro device during pickup may result in a pick failure. If successfully picked, a micro device on a MESA that fails to contact the receiving substrate may fail to place. Even if the transfer of a micro device succeeds in placing the micro device on the receiving substrate, the resulting integrated device may still fail if the interface pressure between micro device and receiving substrate is outside a desired pressure range during placement. For example, pressures that are too high during place could result in structural failure of the device. In another example, pressures below a desired placement pressure range may not make adequate electrical contact or the resulting electrical contract resistance may fall outside a desired range.

In an embodiment, a support substrate with active shape control includes a base substrate including a front side and a back side, a heater element on the front side of the base substrate, a plurality of electrodes on the front side of the base substrate, and a piezoelectric actuator element bonded to the back side of the base substrate to control a curvature of base substrate. The plurality of electrodes may be covered with a dielectric material. In an embodiment, the electrodes may be used to clamp an MPA to the support substrate with electrostatic principles. The base substrate may resemble a pivot mount structure including a pivot platform laterally surrounded by a support structure, with the heater element and the plurality of electrodes located on the front side of the base substrate on the pivot platform, and the piezoelectric actuator element is bonded to the back side of the base substrate on the pivot platform. In an embodiment, a mirror pattern is formed on a back side of the piezoelectric actuator element and/or the back side of the base substrate.

In an embodiment, the support substrate includes one or more strain gages to sense bending strain that is proportional to a curvature of the base substrate. For example, strain gages can produce a signal (e.g. resistance value) that is proportional to a radius of curvature. In this manner, the strain gages may be calibrated to determine the transfer function between resistance and curvature. In an embodiment, a temperature sensor is adjacent to the strain gage(s). In exemplary configurations, the strain gage(s) may be bonded to the piezoelectric actuator element, bonded to the base substrate, or integrated into the base substrate.

The support substrate may be one of several components in a mass transfer tool. In an embodiment, a mass transfer too includes an articulating transfer head assembly including a mounting surface, and a support substrate that is releasably attachable with the mounting surface. For example, the support substrate may include a base substrate including a front side and a back side, a heater element on the front side of the base substrate, and a piezoelectric actuator element bonded to the back side of the base substrate to control a curvature of base substrate.

The articulating transfer head assembly may additionally include one or more displacement sensors arranged over the support substrate to measure displacement of the support substrate at one or more locations. One or more of the displacement sensors is arranged directly over the piezoelectric actuator element in one configuration. In an embodiment, the support substrate further includes one or more strain gages to sense bending strain that is proportional to a curvature of the base substrate. For example, the one or more strain gages may be bonded to the piezoelectric actuator element, bonded to the base substrate, or integrated into the base substrate.

In an embodiment a transfer method includes transferring an array of devices from a donor substrate to a receiving substrate with a mass transfer tool, and operating an active shape control loop while transferring the array of devices (e.g. micro devices) to control a curvature of the array of transfer heads (e.g. an array of electrostatic transfer heads, or array of MESAs). In an embodiment the active shape control loop includes measuring a surface profile of a support substrate supporting the array of transfer heads, and actuating a piezoelectric actuator element to change the curvature of the array of transfer heads. In accordance with embodiments, the transfer method may additionally include heating the support substrate supporting the array of transfer heads with a temperature profile while transferring the array of devices.

In an embodiment, the active shape control loop includes calculating a radius of curvature based on the measured surface profile, calculating an offset between the radius of curvature and a reference, and actuating the piezoelectric actuator element to flatten the radius of curvature, which in turn controls (e.g. flattens) a corresponding surface profile (e.g. radius of curvature) of the MPA and the contact surfaces of the array of transfer heads.

In an embodiment, the active shape control loop includes equating the measured surface profile to a plane and a point value, calculating an offset between the plane and the point value, and actuating the piezoelectric actuator element based on the calculated offset (e.g. to drive the offset to zero), which in turn controls (e.g. flattens) a corresponding surface profile of the MPA and the contact surfaces of the array of transfer heads.

In an embodiment, the transfer method additionally includes contacting the array of devices on the donor substrate with the array of transfer heads while the support substrate supporting the array of transfer heads is maintained at a first temperature, picking up the array of device with the array of transfer heads, translating the array of transfer heads to a receiving substrate, ramping the support substrate supporting the array of transfer heads to a second temperature higher than the first temperature, and contacting the receiving substrate with the array of micro devices while the support substrate supporting the array of transfer heads is at the second temperature.

In accordance with embodiments, some operations may be performed with the aid of software. In an embodiment, a computer-readable storage medium includes executable instructions to cause a processor to perform operations, the instructions including measuring a surface profile of a support substrate supporting an array of transfer heads, and actuating a piezoelectric actuator element to change a curvature of the array of transfer heads. In an embodiment, the instructions additionally include calculating a radius of curvature based on the measured surface profile, calculating an offset between the radius of curvature and a reference, and actuating the piezoelectric actuator element to flatten the radius of curvature. In an embodiment, the instructions additionally include equating the measured surface profile to a plane and a point value, calculating an offset between the plane and the point value, and actuating the piezoelectric actuator element based on the calculated offset (e.g. to drive the offset to zero).

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "front", "back", "over", "to", and "on" as used herein may refer to a relative position of one layer with respect to other layers. One layer "over", or "on" another layer or bonded "to" or in "contact" with another layer may be directly in contact with the other layer or may have one or more intervening layers.

FIG. 1 is a schematic side view illustration of a mass transfer system 100 in which embodiments may be implemented. As illustrated, the mass transfer system 100 may include a transfer head assembly 200, which may releasably retain an MPA 103 for picking up an array of micro devices from a donor substrate held by a donor substrate holder 104, and for transferring and releasing the array of micro devices onto a receiving substrate held by a receiving substrate holder 106. In an embodiment, the MPA includes an array of micro electrostatic assemblies (MESAs), also referred to as electrostatic transfer heads, where each MESA operates in accordance with electrostatic principles to pick up and transfer a corresponding micro device. In an embodiment each MESA has a localized contact point characterized by a maximum dimension of 1-300 μm in both the x- and y-dimensions. In an embodiment, each MESA has a maximum lateral dimension of 1 to 100 μm, or less. In some embodiments, each MESA has a maximum length and width of 20 μm, 10 μm, or 5 μm. Similarly, each micro device, such as a light emitting diode or chip, may have a maximum lateral dimension of 1-300 μm or 1-100 μm, such as 20 μm, 10 μm, or 5 μm. The transfer head assembly 200 may be fixed to a chassis 112 of a mass transfer tool 105 e.g., at a location along a translation track and be moveable in the x, y, or z directions for translation between stages, as well as for tipping, tilting, and movement of the MPA 103 in a z direction based on feedback signals within the mass transfer system 100. The donor substrate holder 104 and receiving substrate holder 106 may also be movable in the x, y, or z directions with a stage 110.

Operation of mass transfer tool 105 and transfer head assembly 200 may be controlled at least in part by a host computer 108. Host computer 108 may control the operation of transfer head assembly 200 based on feedback signals received from various sensors, strain sensing elements, and image data.

Figure 2:
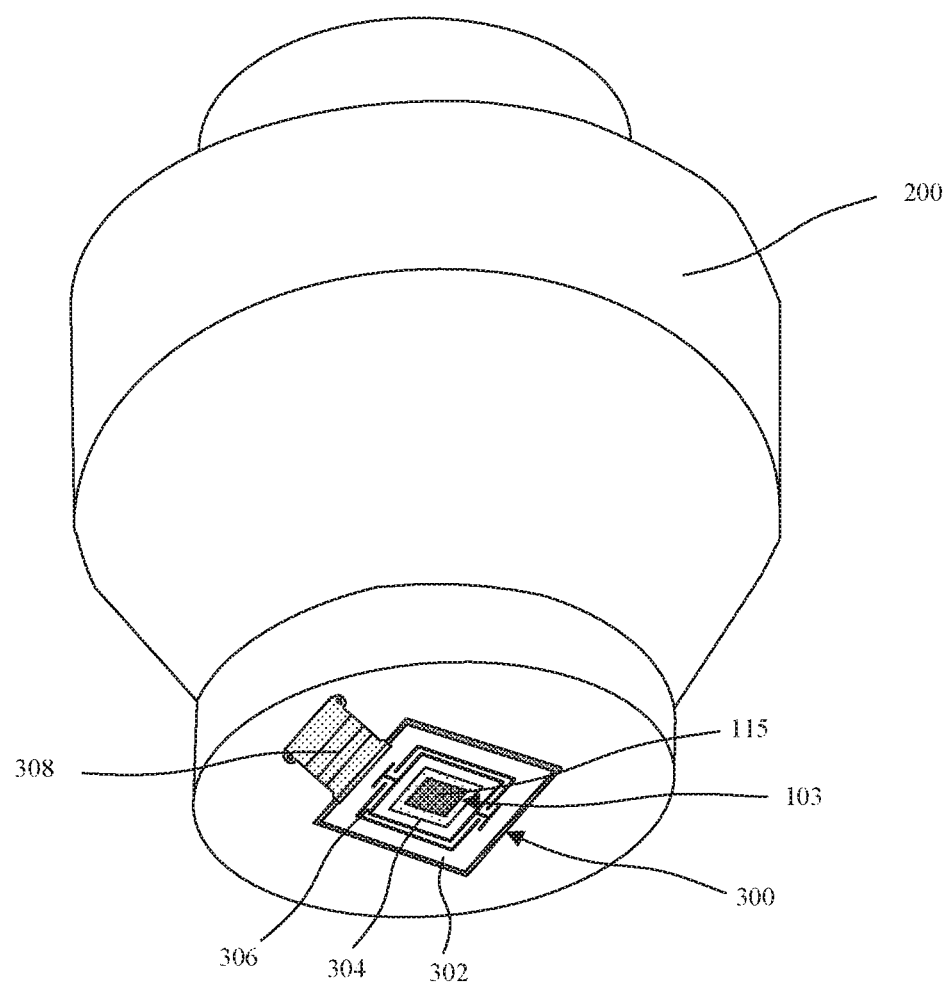
FIG. 2 is a perspective view illustration of a micro pick up array and support substrate mounted onto a transfer head assembly in accordance with an embodiment.

Referring to FIG. 2, a perspective view of a transfer head assembly 200 is shown in accordance with an embodiment. A transfer head assembly 200 may be used in combination with mass transfer tool 105 to transfer micro devices to or from a substrate, e.g., receiving substrate or donor substrate, using MPA 103 which is supported by a support substrate 300. More particularly, transfer head assembly 200 may provide for negligible lateral or vertical parasitic motion for small movements of MPA 103, e.g., motion less than about 5 mrad about a neutral position. Accordingly, transfer head assembly 200 may be incorporated in mass transfer tool 105 to adjust an MPA 103 relative to mass transfer tool 105. The transfer head assembly 200 may be fixed to a chassis of mass transfer tool 105, e.g., at a location along an upper beam or support.

The support substrate 300 may be mounted onto the transfer head assembly 200. This may be accomplished using a variety of manners such as using tabs or lips to press the pivot mount against the transfer head assembly 200, bonding, vacuum, or electrostatic clamping. As illustrated, the support substrate 300 may include a support structure (e.g. base) 302, a pivot platform 304, and plurality of spring arms 306, and the MPA 103 supporting an array of MESAs 115 is mounted on the pivot platform 304. In an embodiment, the support substrate 300 may include a flex circuit 308 to communicate with a printed circuit board (PCB) that is located nearby within the transfer head assembly 200 to reduce signal degradation by limiting a distance that signals must travel.

Figure 3A:
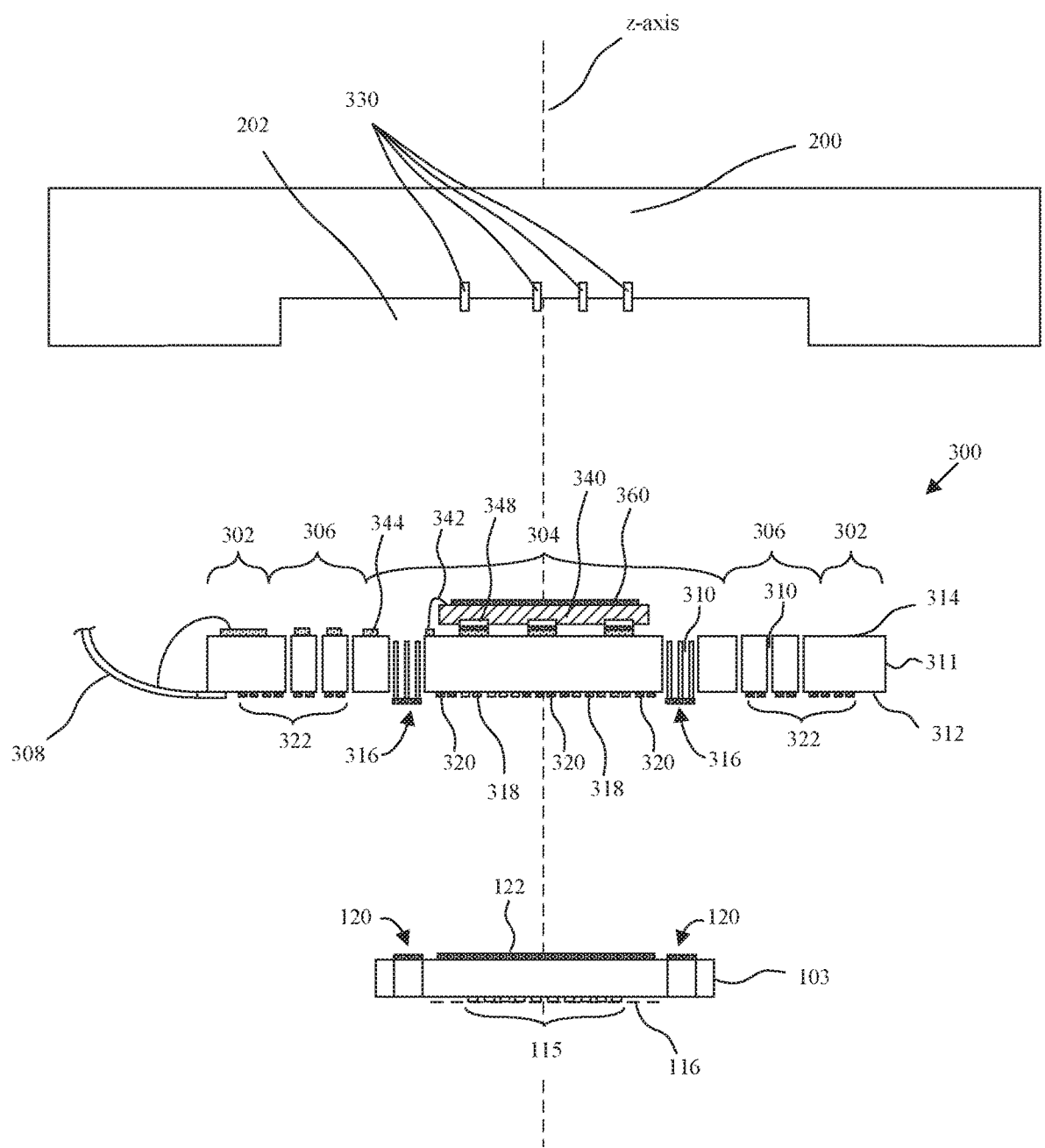
FIGS. 3A-3B are exploded cross-sectional side view illustrations of a transfer head assembly, support substrate, and micro pick up array in accordance with embodiments.
Figure 3B:
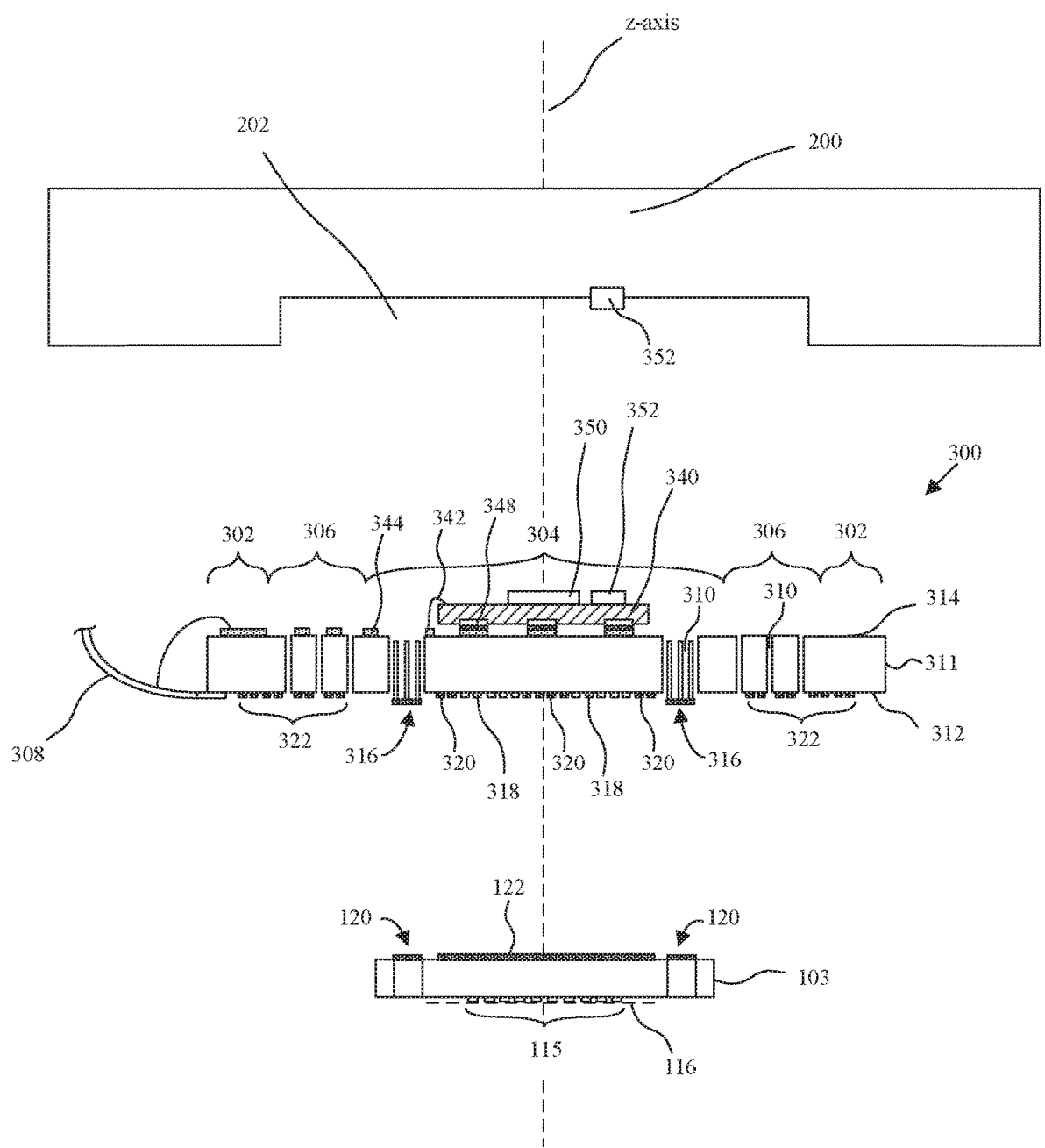

Referring now to FIGS. 3A-3B, exploded cross-sectional side view illustrations are provided of a transfer head assembly 200, support substrate 300, and MPA 103. Generally, the support substrate 300 is mounted onto the transfer head assembly 200. This may be accomplished using a variety of manners such as using tabs or lips to press the support substrate against the transfer head assembly 200, bonding, vacuum, or electrostatic clamping. A deflection cavity 202 may be formed in the transfer head assembly 200 to allow a specified z-deflection distance of the pivot platform 304 along the z-axis.

The support substrate 300 may include a base substrate 311. In an embodiment, the base substrate 311 is made from silicon using micro electrical mechanical systems (MEMS) fabrication techniques. As illustrated in FIGS. 3A-3B channels 310 may be formed through a body of the base substrate 311 from a front side 312 to back side 314. Channels 310 may be used to form a variety of compliant features of the support substrate 300, including defining the spring arms 306 and pivot platform 304, as well as compliant voltage contacts 316. The compliant voltage contacts 316 may provide a low contact resistance connection to voltage contacts 120 of the MPA 103. In the embodiments illustrated, the compliant voltage contacts 316 protrude from the pivot platform 304 such that they are raised above the pivot platform 304. Electrodes 318, 122 may be utilized to provide a voltage to electrostatically clamp the MPA 103 onto the pivot platform 304. In accordance with embodiments, the clamping pressure is sufficient to withstand thermal distortions of the structure, and physical distortions induced by the piezoelectric actuator element 340 as well as any external factors. Upon clamping the MPA 103 onto the pivot platform of the support substrate 300 with the opposing electrodes 318, 122, the compliant voltage contacts 316 exert a pressure upon the MPA contacts 120. The electrodes 318 and compliant voltage contacts 316 may each include a metallic layer on the front side 312 of the base substrate 311. In an embodiment, the metallic layer of the electrodes 318 is covered by a dielectric material layer, while the metallic layer of the compliant voltage contacts 316 is exposed. Additional features may be located on the base substrate 311. For example, one or more heater elements 320 (e.g. thin film heater elements) may be located on the front side 312 of the base substrate 311. During micro device transfer, the heater elements 320 may maintain the support substrate 300 and MPA 103 at an elevated temperature relative to a donor substrate or relative to a receiving substrate. Wiring layers 322 may connect the one or more heater elements 320, and metallic layers of the electrodes 318 and compliant voltage contacts 316 to a flex circuit 308 on the front side 312 of the base substrate 311.

Figure 3C:
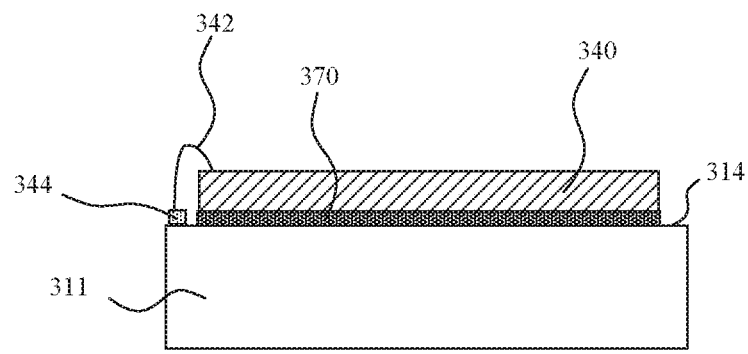
FIGS. 3C-3D are close up cross-sectional side view illustrations of bonded piezoelectric actuator elements in accordance with embodiments.
Figure 3D:
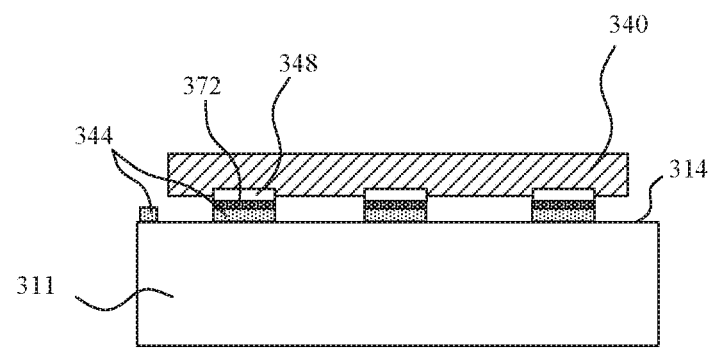

Still referring to FIGS. 3A-3B, in the embodiments illustrated, the support substrate 300 additionally includes a piezoelectric actuator element 340 bonded to the back side 314 of the base substrate 311 to control a curvature of the base substrate 311, and resultantly, a curvature of the MPA 103 and the contact surfaces of the array of MESAs 115. In an embodiment, the piezoelectric actuator element 340 is bonded with metal-metal bonding or an adhesive (e.g. a thermoset material) to the pivot platform 304. The piezoelectric actuator element 340 may be electrically connected with the support substrate 300 using various techniques, including wire bonds 342 or bottom contacts 348 on the bottom side of the piezoelectric actuator element 340. In either configuration, the wire bonds 342 or bottom contacts 348 may be connected to electrical wiring 344 on the back side 314 of the base substrate 311. The electrical wiring 344 may additionally be electrically connected to the flex circuit 308 through additional wire bonding, or vias formed through the base substrate 311. FIGS. 3C-3D are close up illustrations of exemplary bonding configurations for a piezoelectric actuator element. In the embodiment illustrated in FIG. 3C, the piezoelectric actuator element 340 is bonded to the back side 314 of the base substrate 311 with a bonding layer 370, such as an adhesive material, solder material, or metal-metal bond, and electrically connected to the electrical wiring 344 with wire bonds 342. In the embodiment illustrated in FIG. 3D, piezoelectric actuator element 340 bottom contacts 348 are bonded to and electrically connected with the electrical wiring 344 on the back side 314 of the base substrate 311. For example, this may be accomplished with an electrically conductive bonding material 372, such as a solder material, or metal-metal bond s (e.g. formed with the bottom contacts 348 and electrical wiring 344).

The surface to which the piezoelectric actuator element 340 is bonded may be opposite the side used for clamping the MPA 103. In an embodiment, the piezoelectric actuator element 340 material is lead zirconate titanate (PZT). In an embodiment, the piezoelectric material is PZT Type 5A. The bonded structure of the base substrate 311 and piezoelectric actuator element 340 together comprise a 2-layer monomorph bender in which the active layer is the piezoelectric actuator element 340 and the passive layer is the pivot platform 304 of the base substrate 311. In an embodiment, the piezoelectric actuator element 340 is poled normal to the base substrate 311 such that the $d_{33}$ direction is in the "Z" direction of the structure. Because the piezoelectric actuator element 340 is bonded to the pivot platform 304, forming a monomorph bending structure, changes in voltage across the piezoelectric actuator element 340 will result in out-of-plane bending of the structure. If the piezoelectric actuator element 340 is substantially symmetric with the pivot platform 304, the out-of-plane bending will be substantially symmetric to the pivot platform (centered on the structure—the center of curvature coincides with the z-axis of the structure).

During micro device transfer, the MPA 103 may be electrostatically clamped to the support substrate 300. The clamping pressure between the MPA 103 and support substrate 300 may be between 1 and 10 atmospheres in some embodiments. It has been demonstrated that a clamping pressure of this magnitude range can be sufficient to maintain shape conformity of the MPA 103 to the support substrate 300. Hence, changes in shape in the support substrate 300 will correspond directly to a change in curvature in the MPA 103. In other words, by actively controlling the shape of the support substrate 300 it is possible to correspondingly control the shape of the MPA 103, and hence the curvature along the contact surfaces of the array of MESAs 115.

In accordance with embodiments, the shape control elements are incorporated into the transfer head assembly 200 and support substrate 300. This approach may allow for active shape control of the MPA 103 without requiring new features and added cost in the MPA 103, supporting a strategy in which the MPA 103 is a consumable element in a micro device transfer manufacturing process.

Referring now to FIG. 3A, in an embodiment, a plurality of contactless displacement sensors 330 may be aimed at a face of the monomorph bending structure, which includes the base substrate 311 and the piezoelectric actuator element 340. An exemplary displacement sensor 330 is the SI-F Series spectral interference laser displacement sensor from Keyence Corporation of Japan. Other types of appropriate displacement sensors include a Shack-Hartmann wavefront sensor, capacitive sensor, and inductive sensor.

In an embodiment, a displacement sensor 330 may be placed at a fixed reference position relative to a support substrate 300 bending structure. The displacement sensor may be aimed to measure the z position of a point on the support substrate 300 bending structure. The point may be located at the axis of symmetry (e.g. along x, y, z axes) of the support substrate 300 bending structure, or may be located at a known position off-axis. In such an arrangement the displacement sensor will measure a change in z position at the point that is proportional to the change in the curvature of the support substrate 300 bending structure. While such an arrangement can produce a signal corresponding to the change in curvature, additional reference information about the initial shape of the support substrate 300 bending structure is utilized by an active shape control algorithm to report the measured surface profile/curvature, such as a radius of curvature, of the deformed structure.

In another embodiment, two or more displacement sensors 330 may be placed at fixed reference positions relative to a support substrate 300 bending structure. The fixed reference positions may be common, such as along a same radius from the axis of symmetry (along the z-axis) of the pivot platform 304. One or more of the displacement sensors 330 may be located near the axis of symmetry. The displacement sensors 330 may be aimed to measure the z positions of two or more different points on the support substrate 300 bending structure. The points may each be located at two different radii from the axis of symmetry of the support substrate 300 bending structure. In such an arrangement the displacement sensors may each measure a change in the z position at each of the points that is proportional to the change in the radius of curvature of the support substrate 300 bending structure. In accordance with embodiments, when the support substrate 300 bending structure is substantially flat (having zero curvature) the two or more displacement sensors 330 will record the same distance. This may correspond to calibrated values of the displacement sensors so that their measurements are referenced to a truly flat state. As the curvature of the support substrate 300 bending structure changes, the displacement sensors 330 will record different displacements. In an embodiment, using these displacement values at each of the points and knowing the position of each of the points relative to the axis of symmetry, it is possible to calculate the equation of a sphere whose center lies on the axis of symmetry and whose surface corresponds to the surface of the support substrate 300 bending structure, and, by extension, the face of the MPA 103 (e.g. the contact surface 116 of the MESAs 115). From this equation, the radius of curvature of the face of the MPA 103 (e.g. contact surface 116) can be known.

In an embodiment, one or more mirror patterns 360 are formed on the back side of the piezoelectric actuator element 340, and vertically aligned with the one or more displacement sensors 330. In this manner, the reflective mirror pattern 360 can aid signal integrity. In an embodiment, the one or more mirror patterns 360 are formed of a reflective material (e.g. gold), and may have an average surface roughness, Ra, of 2,000 Angstroms or less. The one or more mirror patterns 360 may be formed on the back side of the base substrate 311 in addition to, or alternatively to the back side of the one or more piezoelectric actuator elements 340.

In an embodiment, three or more displacement sensors 330 are arranged at a common radius from the axis of symmetry of the pivot platform 304 and an additional displacement sensor 330 is located near the axis of symmetry. Using this arrangement information about the rotation of support substrate 300 about the x axis, rotation of the support substrate 300 about the y axis, displacement of the support substrate 300 in the z direction, and curvature of the support substrate 300 are obtained. Incorporation of a larger array of displacement sensors 330 may be deployed to obtain more complex topography information.

Other methods may be used to sense the shape of the active shaping system. For example, in the embodiment illustrated in FIG. 3B one or more strain gages 350 can be located at any of the piezoelectric actuator element 340, pivot platform 304, or MPA 103 to sense bending strain, which will be proportional to the curvature of the bending structure. In an embodiment, one or more metal foil strain gages 350 of constantan or nickel-iron alloys are bonded to a top surface of the piezoelectric actuator element 340. Alternate strain gage 350 embodiments include thin film metal gages incorporated into the base substrate 311. Yet another alternate strain gage 350 would be a piezoresistive doped Si strain gage, also incorporated into the base substrate 311. Strain gages generally register a change in resistance to both strain (characterized by the strain gage material's gage factor) and to temperature (characterized by the strain gage materials thermal coefficient of resistance). In accordance with embodiments, it may be beneficial to compensate for thermal changes in the measured structure. One manner for compensating for thermal changes is by use of a reference strain gage affixed to the measured structure and exposed to the same temperature as a primary measurement gage but oriented in a way that does not undergo any mechanical strain as the structure is stressed. However, there may be no region of the monomorph bender configuration in which there is a component of strain of unchanging magnitude as the structure is stressed. For this reason, in an embodiment a temperature sensor 352 may be incorporated to provide a reference temperature measurement to compensate for thermally-induced changes in strain in the strain gage 350. Exemplary temperature sensors may be a resistive thermal device (RTD), thermocouple, and contactless temperature sensor (e.g. infrared temperature sensor). For example, an RTD or thermocouple temperature sensor 352 may be incorporated on the support substrate 300 (e.g. on the piezoelectric actuator element 340) adjacent a strain gage 350. A contactless (e.g. infrared) temperature sensor 352 may be incorporated at another location, for example, on the transfer head assembly 200 and directed at a portion of the piezoelectric actuator element 340 adjacent the strain gage 350. In an embodiment, a strain gage calibration algorithm 1) measures the strain gage resistance, 2) measures the temperature value (such as an RTD resistance value, for example), 3) calculates a strain based on a formula representing the relationship among strain gage resistance, temperature value, and strain. The formula representing this relationship may be determined during a calibration routine. The resulting calculation of strain is then used as a feedback signal in a control loop.

Figure 4:
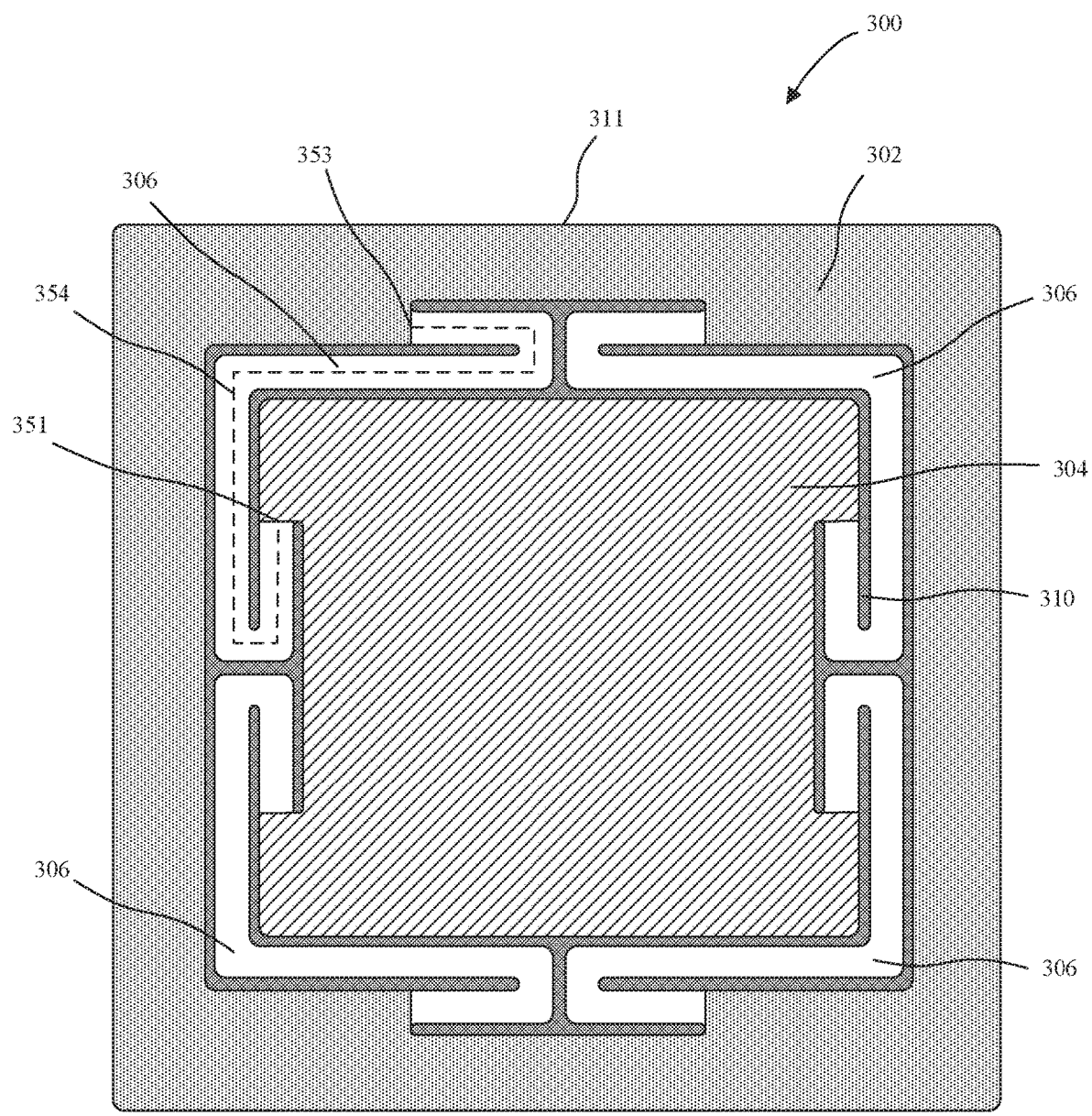
FIG. 4 is a top view illustration of various structural features of a support substrate in accordance with an embodiment.
Figure 5:
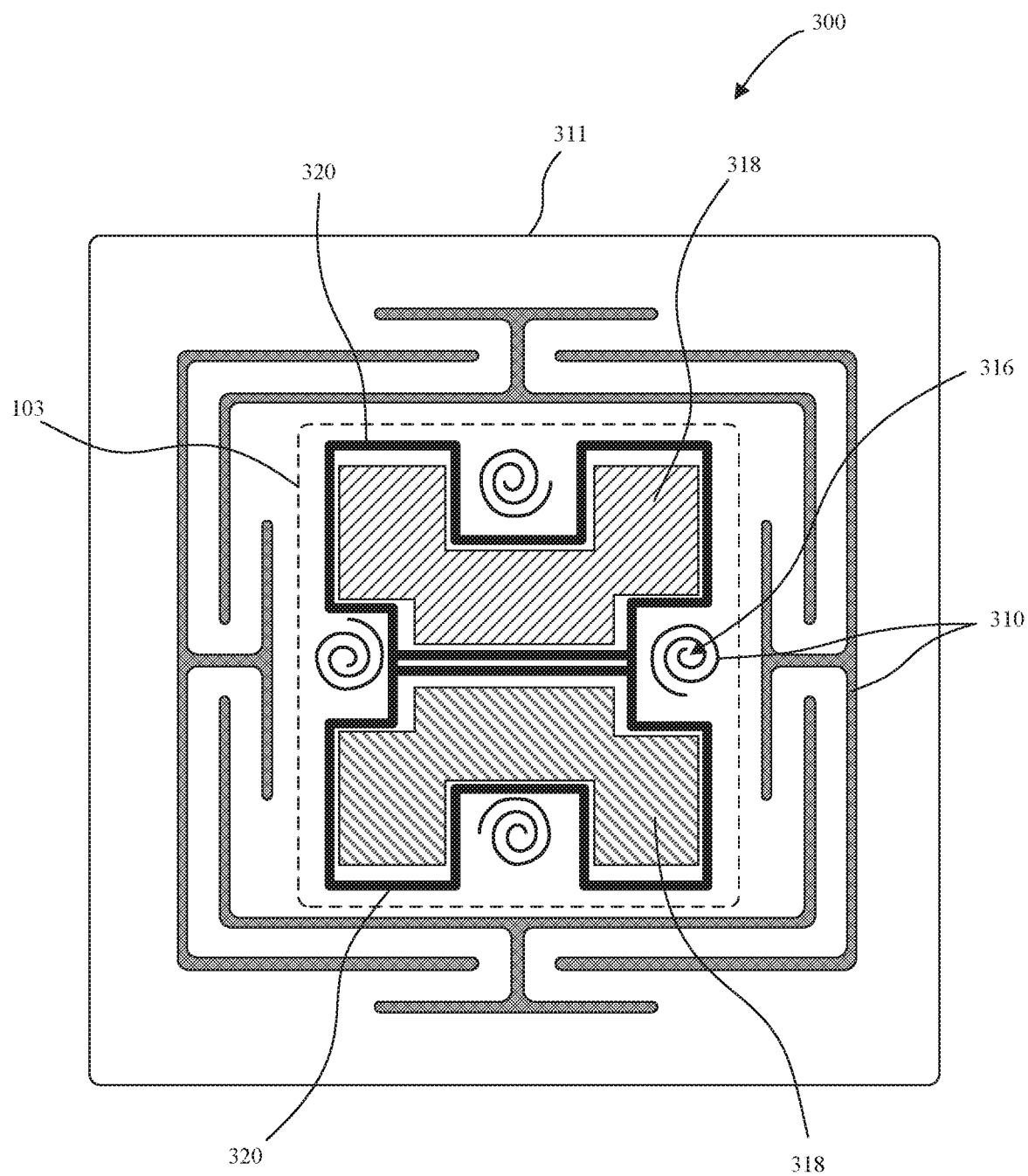
FIG. 5 is a bottom view illustration of various structural features of a support substrate in accordance with an embodiment.

Referring now to FIG. 4 a top view illustration is provided of various structural features of an exemplary support substrate 300 in accordance with an embodiment. FIG. 5 is a bottom view illustration of various structural features of a support substrate in accordance with an embodiment. As shown, a support substrate 300 may resemble a pivot mount structure, which includes a support structure 302, a pivot platform 304, and a plurality of spring arms 306. Each spring arm 306 is fixed to the pivot platform 304 at a corresponding inner root 351, and fixed to the support structure at a corresponding outer root 353. In the embodiment illustrated, each spring arm 306 is characterized by an axial length 354 and may include one or more switch-backs. Channels 310 may be formed through a body of the base substrate 311 to form a variety of compliant features of the support substrate 300, including defining the spring arms 306 and pivot platform 304, as well as compliant voltage contacts 316.

Referring specifically to FIG. 5, the one or more heater elements 320, electrodes 318, and compliant voltage contacts 316 may be formed on or within the pivot platform 304 and within a periphery of the MPA 103 that is clamped to the pivot platform 304.

Figure 6:
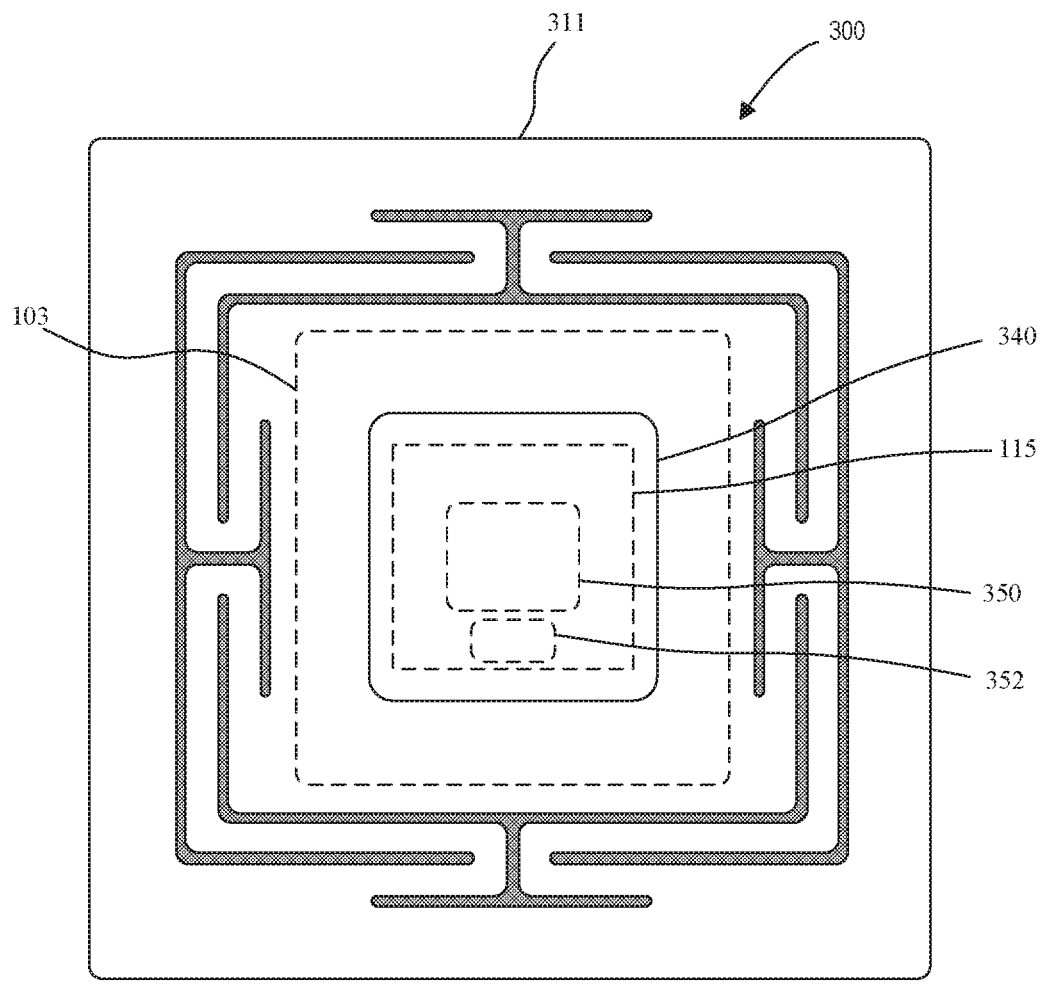
FIG. 6 is a schematic top-bottom view illustration of various structural features of a support substrate in accordance with an embodiment.

FIG. 6 is a schematic top-bottom view illustration of various structural features of a support substrate in accordance with an embodiment. FIG. 6 is an illustration of one embodiment, and embodiments are not so limited. For example, as shown in FIG. 6, the piezoelectric actuator element 340 may occupy a larger area than the array of MESAs 115. In the particular embodiment illustrated, the optional strain gage 350 and temperature sensor 352 are bonded to a back side of the piezoelectric actuator element 340, though embodiments are not so limited. In the embodiment illustrated, the piezoelectric actuator element 340 is substantially symmetric with the MPA 103 and pivot platform 304, though embodiments are not so limited.

Figure 7:
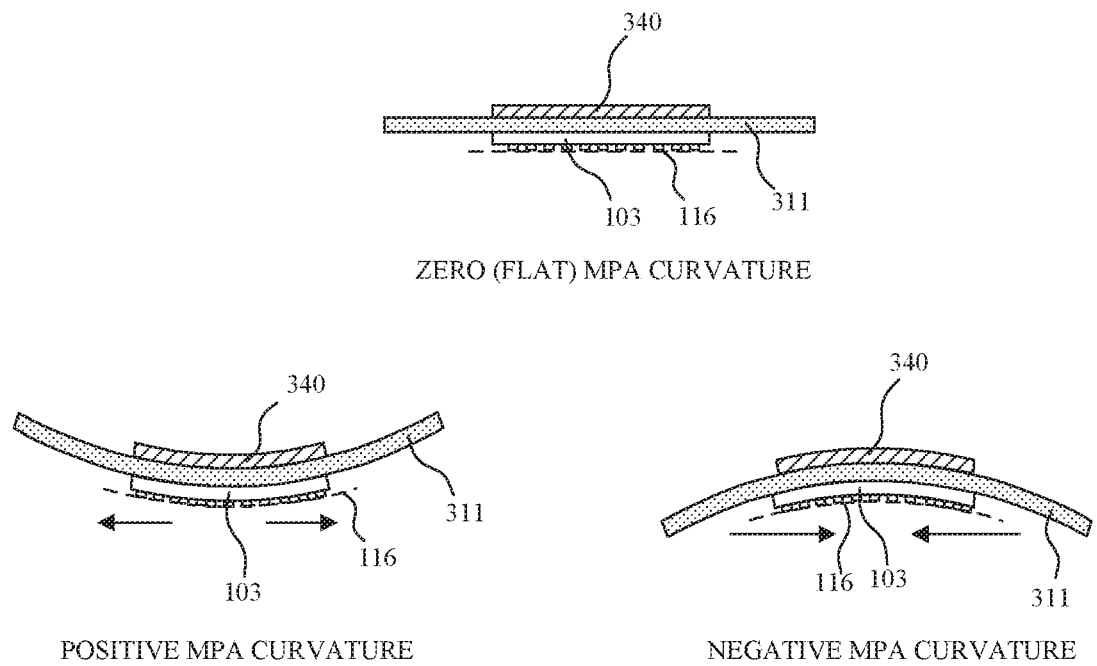
FIG. 7 is a schematic cross-sectional side view illustration of support substrate curvature in accordance with embodiments.

During a transfer sequence in accordance with embodiments there may be large thermal differentials at the contact interface between the MPA 103 and the target substrate (e.g. donor substrate or receiving substrate). For example, precontact thermal differentials can be on the order of 200° C.

between the MPA 103 and the target substrate. This can result in a thermal gradient from the front side of the MPA 103 to the back side of the support substrate 300 at the time of initial contact. This gradient can result in a thermal-strain-induced curvature of the MPA 103, which would otherwise be flat when the thermal gradient is zero. As illustrated in FIG. 7, such curvature may be positive (concave up) or negative (concave down), depending on the conditions. Out-of-plane curvature in the MPA 103 may be on the order of microns deviation from flat in some embodiments.

In accordance with embodiments, the change in curvature of the support substrate 300 may be measured directly during pick and place operations and simultaneously correlated to the changing temperature gradient during the transfer process. Results from experimentation, analysis, and simulation demonstrate that the expected shape change in the MPA 103 and support substrate 300 structure may be dominated by plate bending. This is because the magnitude of the thermal gradient in the MPA and support substrate structure can be greatest in the Z dimension. Further, results show that the most common manifestation of the shape change may be out-of-plane bending that is substantially constant in radius (spherical) and rotationally symmetric about the center of the support substrate 300 pivot platform 304 (along the z-axis).

Figure 8:
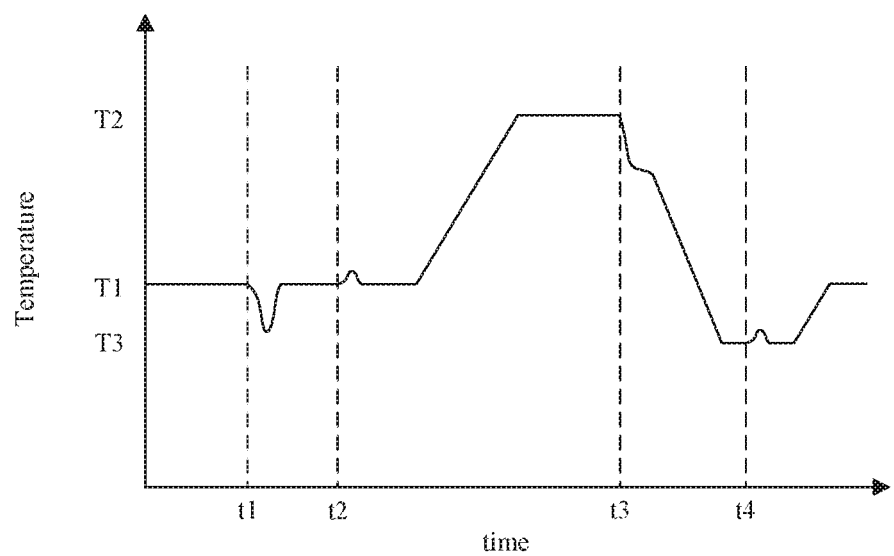
FIG. 8 is a chart illustrating a temperature profile of a support substrate during a micro device transfer operation in accordance with an embodiment.

Referring now to FIG. 8 a chart is provided illustrating an exemplary temperature profile of a support substrate 300 during a micro device transfer operation in accordance with an embodiment. As illustrated, T1, T2, T3 are elevated temperatures above room temperature. Time t1 corresponds to the time in which the MPA 103 makes contact with an array of micro devices on a donor substrate. Time t2 corresponds to the time in which the array of micro devices are picked up from the donor substrate with the MPA 103. Time t3 corresponds to the time in which the receiving substrate is contacted with the array of micro devices. Time t4 corresponds to the time in which the array MPA is removed from the receiving substrate, leaving the bonded micro devices on the receiving substrate. As illustrated, thermal disturbances may be observed when contacting and releasing the micro devices, resulting in a change in curvature of the MPA 103, and correspondingly the curvature of the support substrate 300. Changes in curvature may additionally be observed during thermal ramping operations between T1, T2, T3. Physical strain inducing moments associated with contacting or disengaging the micro devices and substrates may additionally contribute to the changes in curvature. It is to be appreciated that the temperature profile provided in FIG. 8 is exemplary and embodiments envision a large number of variations with temperature. For example, T2 may be lower than T1, or the temperature may change continuously with time. Temperature may change with set point, or change due to changes in external conditions (for example, when the array of transfer heads is in contact with a substrate with high thermal conductivity and heat flows out of the system faster than the heater can supply heat into the system). In accordance with embodiments, the bending assembly may have a corresponding unique curvature with each temperature, and the active shape control system addresses this by countering the thermal strain at every operating temperature.

Figure 9:
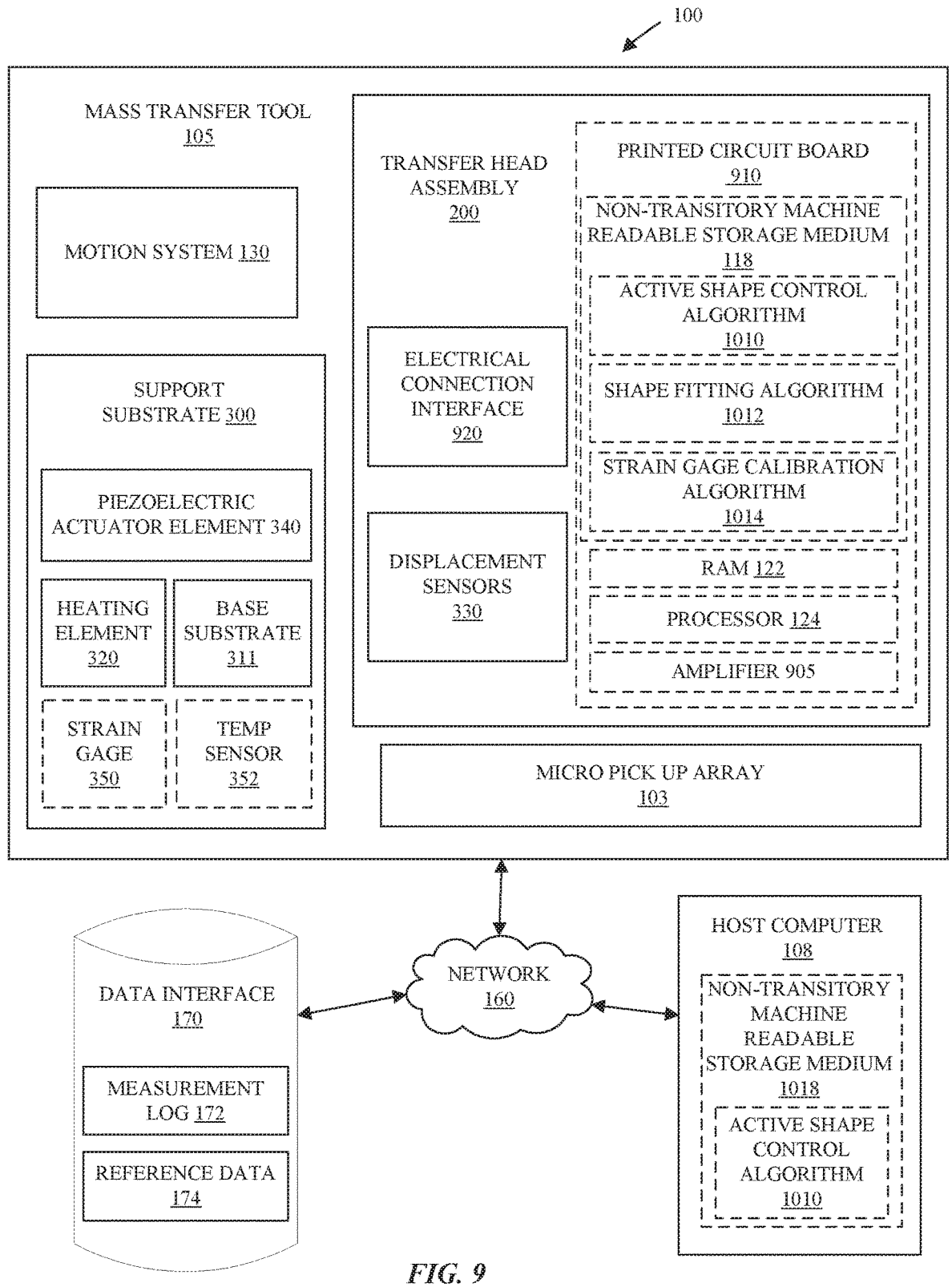
FIG. 9 is a schematic illustration of a mass transfer system in accordance with an embodiment.

FIG. 9 is a schematic illustration of a mass transfer system 100 in which embodiments may be implemented. As illustrated, the mass transfer tool 105 of the mass transfer system 100 includes the transfer head assembly 200, a motion system 130 for translating the transfer head assembly 200, the support substrate 300, and the MPA 103. Subsystems of the mass transfer tool 105 may be in communication with a host computer 108 and a data interface 170 over a network 160. The network 160 may be a local area network (LAN), a wireless network, a mobile communications network, a wide area network (WAN), and can include any number of networking and computing devices, including wired and wireless devices. Data interface 170 may optionally be located on the host computer 108 or the mass transfer tool 105.

In an embodiment, a printed circuit board (PCB) 910 is installed on the transfer head assembly 200, or elsewhere in the mass transfer system. The PCB 910 may include software (e.g. active shape control algorithm 1010, shape fitting algorithm 1012, strain gage calibration algorithm 1014, etc.) stored on a non-transitory machine readable storage medium 118, random access memory (RAM) 122, and a processor 124, such as an application specific integrated circuit (ASIC) or field programmable gate array (FPGA). In another embodiment, different software may be located on separate PCBs, at one or more locations in the mass transfer system. In accordance with embodiments, the software is executed within a feedback control loop that provides active control of an active MPA 103 shaping apparatus based on bending feedback from an array of displacement sensors 330 and/or strain gage 350 and temperature sensor 352. The PCB 910 may receive commands and report status and performance data to the host computer 108 over a data interface, such as network 160. The information compiled by printed circuit board 910 may be stored in a data interface 170 in a format and location useful for the transfer process and for future analysis. For example, bending information may be stored in an inspection log 172 for immediate in-process use to effect changes to the transfer procedure. Reference data 174 data (e.g. displacement sensor 330, strain gage 350, temperature sensor 352 reference data) may also be stored in the data interface 170.

In an embodiment an electrical connection interface 920 provides electrical connection to the piezoelectric actuator element 340. For example, the electrical connection interface 920 may provide an electrical connection between the PCB 910, or amplifier 905, and the piezoelectric actuator element 340. The electrical connection interface 920 may additionally provide electrical connection between the displacement sensors 330 and/or strain gage(s) 350 and temperature sensor 352 and the PCB 910. The electrical connection interface 920 may carry signals such as a ground and drive voltage for the piezoelectric actuator element 340. In embodiments in which a strain gage(s) 350 and temperature sensor 352 are employed the electrical connections may include signals associated with those elements, as well.

Figure 10A:
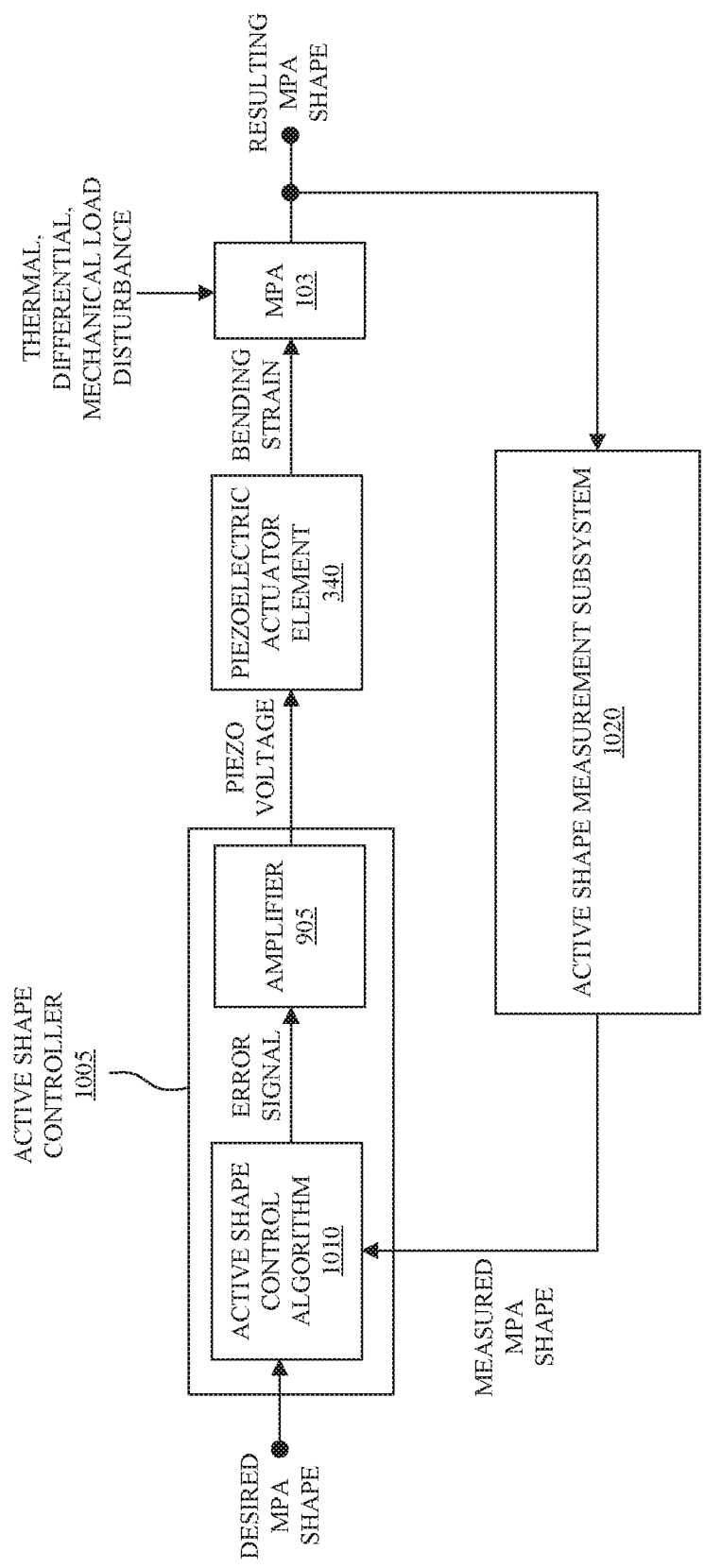
FIG. 10A is a flow chart illustrating a control loop in accordance with an embodiment.

Referring now to FIG. 10A, in accordance with embodiments, various components of the mass transfer system 100 may be grouped together to form an active shape controller 1005 and active shape measurement subsystem 1020. In an embodiment, the active shape controller 1005 includes the active shape control algorithm 1010 and amplifier 905, both of which may optionally be located on the PCB 910. The active shape controller 1005 provides active control of MPA 103 shaping based on measured bending feedback from an active shape measurement subsystem 1020, and optionally reports status to the host computer 108.

FIG. 10A is a flow chart illustrating a control loop in accordance with an embodiment. As shown, a desired MPA 103 shape is input into the active shape control algorithm 1010 of the active shape controller 1005. For example, this may include reference data 174 stored in the data interface 170. The active shape control algorithm 1010 may compare a measured surface profile and associated calculated MPA shape (e.g. radius of curvature, plane, point value) to a reference value (e.g. reference curvature or point value), and provide an error signal to an amplifier 905, which in response applies one or more gain values to the error signal and adjusts an output voltage. The amplifier 905 sends an operating voltage through the electrical connection interface 920 to actuate the piezoelectric actuator element 340, resulting in a bending strain in the MPA 103. Depending upon the circumstances and place within the pick and place sequence, the MPA 103 may simultaneously or sequentially (before or after) experience a thermal differential or mechanical load disturbance, resulting in the resultant MPA shape.

In accordance with embodiments, the control loop may continuously run during the transfer sequence in which the resulting MPA 103 shape is continuously measured, compared to a control reference with the active shape control algorithm 1010, and an error signal is output to the amplifier 905. In an embodiment, the active shape measurement subsystem 1020 continuously measures a surface profile of the support substrate 300 that supports an array of MESAs 115 (e.g. of the MPA 103), and the amplifier 905 actuates a piezoelectric actuator element 340 to change a curvature of the array of MESAs 115.

In accordance with embodiments, various components of the mass transfer system 100 may be grouped together to form the active shape measurement subsystem 1020. For example, the active shape measurement subsystem 1020 may include a shape fitting algorithm 1012, optional strain gage calibration algorithm 1014, as well as any displacement sensors 330, strain gages 350, temperature sensors 352 utilized. Thus, the active shape measurement subsystem 1020 may include software on one or more PCBs 910, and hardware components located on the transfer head assembly (e.g. displacement sensors 330) and/or strain gage(s) 350 and temperature sensor 352 located on the support substrate 300, and be connected by the electrical connection interface 720.

In such embodiments, the measured surface profile may be a single measurement from a single displacement sensor 330 or strain gage 350, or a plurality of measurements from a plurality of displacement sensors 330 or strain gages 350. Selection of equating the measured surface profile to a plane, radius of curvature, or more complex topography may be at least partially determined by accuracy required, servo rate of the control loop, thermal time constant for system materials employed, micro device transfer rates, and temperature profile ramp rates.

Figure 10B:
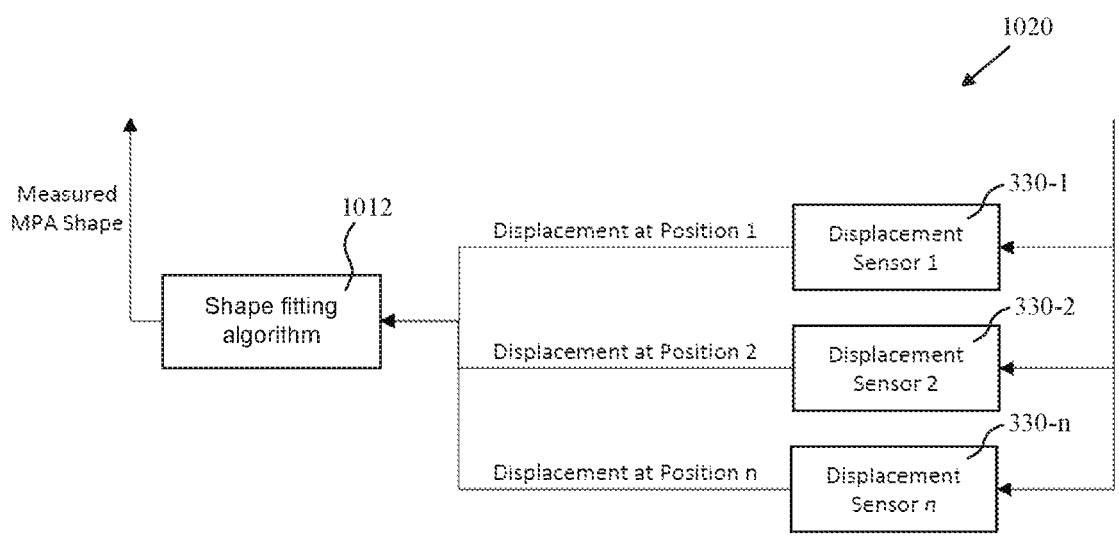
FIG. 10B a is a flow chart illustrating an active shape measurement process utilizing displacement sensors in accordance with an embodiment.

FIG. 10B a is a flow chart illustrating an active shape measurement process utilizing displacement sensors in accordance with an embodiment. As illustrated, measurement data from one or more displacement sensors 330-1, 330-2 . . . 330-$n$ is input into the shape fitting algorithm 1012, which converts a measured set of displacement values to the measured MPA shape. Thus, the shape fitting algorithm 1012 may measure a surface profile of the support substrate 300 and equate the measured surface profile (e.g. curvature) to a measured MPA 103 shape (e.g. plane, radius of curvature, or more complex topography).

Figure 10C:
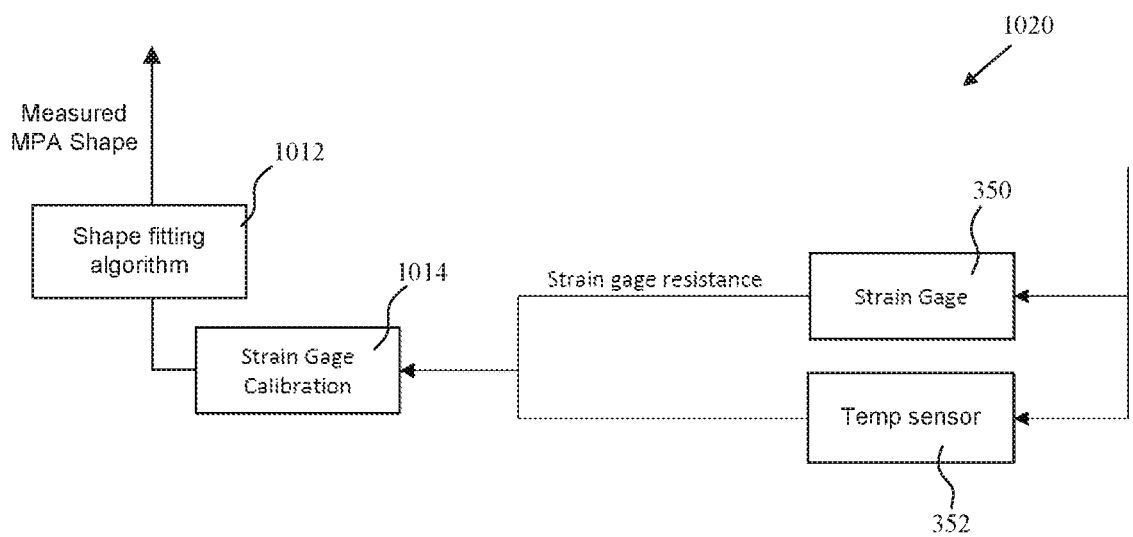
FIG. 10C a is a flow chart illustrating an active shape measurement process utilizing strain sensing in accordance with an embodiment.

FIG. 10C a is a flow chart illustrating an active shape measurement process utilizing strain sensing in accordance with an embodiment. As illustrated, measurement data from one or more strain gages 350 and temperature sensors 352 is input into the strain gage calibration algorithm 1014, which takes a raw strain gage resistance value and a temperature measurement and produces a value proportional to mechanical strain independent of temperature, and references the strain value equivalent to a zero-curvature condition. A calibrated strain measurement from the strain gage calibration algorithm is then input into the shape fitting algorithm 1012, which converts the strain measurement value to a measured MPA shape. Thus, the strain gage calibration algorithm and shape fitting algorithm 1012 may measure a surface profile (e.g. curvature) of the support substrate 300 and equate the measured surface profile to a measured MPA 103 shape (e.g. plane, radius of curvature, or more complex topography).

Figure 11A:
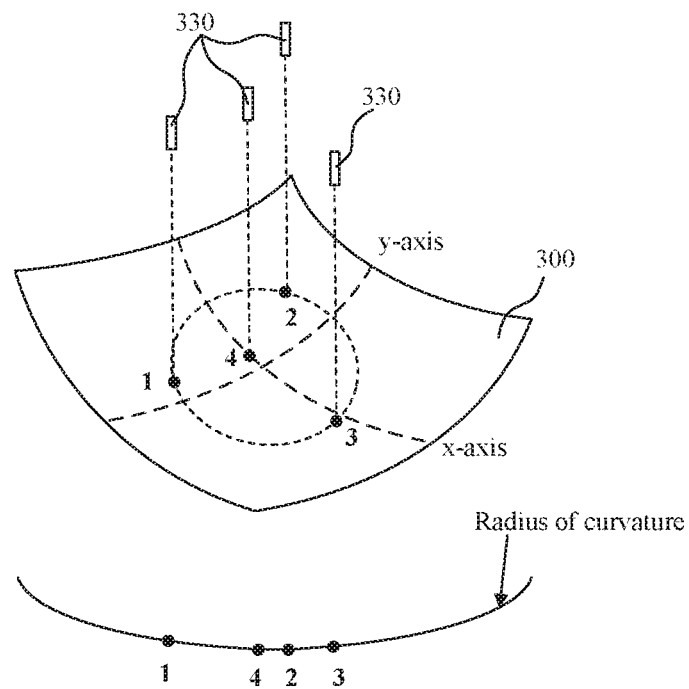
FIG. 11A is conceptual illustration of a method of determining a shape-fitting feedback signal including calculating a radius of curvature in accordance with an embodiment.

FIG. 11A is conceptual illustration of a method of determining a shape-fitting feedback signal including calculating a radius of curvature in accordance with an embodiment. In the particular embodiment illustrated, a plurality of displacement sensors 330 are illustrated, though a plurality of strain gages 350 may also be utilized. In the particular embodiment illustrated, four displacement sensors 330 are arranged to measures a distance in the z direction to either of the base substrate 311 or piezoelectric actuator element 340. As shown, displacement sensors 1-3 may be at (x, y) positions not in a straight line, for example a circle. In an embodiment, the displacement sensors 1-3 are equally spaced along a circle concentric to the center axis of the piezoelectric actuator element 340. The fourth displacement sensor may be at an (x, y) position that is not along the radius of the circle. For example, the fourth displacement sensor may be located a known distance from the center axis. Referring now to FIG. 10B (or alternatively FIG. 10C) the multiple displacement sensors 330 measure a distance to the target at each sensor location, resulting in the array of points (x1, y1, z1), (x2, y2, z2), (x3, y3, z3), (x4, y4, z4) which are input into the shape fitting algorithm 1012, which in turn calculates an equation of a sphere defined by the four points, and outputs a measured radius of curvature based on a best-fit sphere calculation. Referring to FIG. 10A, the measured radius of curvature (i.e. measured MPA shape) is compared against a reference (e.g. desired MPA radius of curvature) with the active shape control algorithm 1010, which outputs an error signal to the amplifier 905. The amplifier 905 then applies one or more gain values to the error signal and adjusts its output voltage to the piezoelectric actuator element 340 in response to the error signal. In accordance with embodiments, this may cause the piezoelectric actuator element 340 to flatten the measured radius of curvature.

Figure 11B:
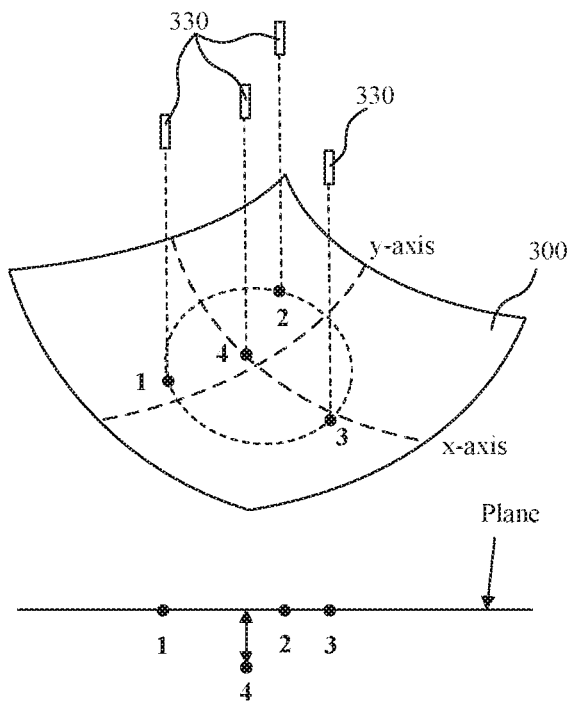
FIG. 11B is conceptual illustration of a method of determining a shape-fitting feedback signal including calculating z-offset of a plane in accordance with an embodiment.

FIG. 11B is conceptual illustration of a method of determining a shape-fitting feedback signal including calculating z-offset of a plane in accordance with an embodiment. In the particular embodiment illustrated, a plurality of displacement sensors 330 are illustrated, though a plurality of strain gages 350 may also be utilized. In the particular embodiment illustrated, four displacement sensors 330 are arranged to measures a distance in the z direction to either of the base substrate 311 or piezoelectric actuator element 340. As shown, displacement sensors 1-3 may be at (x, y) positions not in a straight line, for example a circle. In an embodiment, the displacement sensors 1-3 are equally spaced along a circle concentric to the center axis of the piezoelectric actuator element 340. The fourth displacement sensor may be at an (x, y) position that is not along the radius of the circle. For example, the fourth displacement sensor may be located a known distance from the center axis. Referring now to FIG. 10B (or alternatively FIG. 10C) the multiple displacement sensors 330 measure a distance to the target at each sensor location, resulting in the array of points (x1, y1, z1), (x2, y2, z2), (x3, y3, z3), (x4, y4, z4) which are input into the shape fitting algorithm 1012, which in turn calculates an equation of a plane defined by the first three points, and additionally calculates an offset of the distance between the plane and the fourth point (x4, y4, z4). The control loop in accordance with embodiments, functions to reduce the offset, with the flat state corresponding to a zero offset value. Referring to FIG. 10A, the measured offset (i.e. measured MPA shape) is compared against a reference (e.g. zero value corresponding to a flat state) with the active shape control algorithm 1010, which outputs an error signal to the amplifier 905. The amplifier 905 then applies one or more gain values to the error signal and adjusts its output voltage to the piezoelectric actuator element 340 in response to the error signal.

The above description of an apparatus for actively controlling the shape of a MPA is intended to describe several embodiments and should not be considered limited to the technologies identified. Particular system elements described in the embodiments could be substituted for alternate technologies without altering the underlying methods of as an integral part of the micro device transfer process.

Additionally, passive methods may be used to minimize thermally-induced curvature in the MPA 103. For example, substantially increasing the stiffness of the MPA 103 and support substrate 300 structure can reduce, though possibly not eliminate, any curvature. One method of increasing the stiffness is to increase the thickness of the MPA 103 or pivot platform 304. Increases in the thickness correspondingly increase the section modulus of the structure, making the structure more difficult to bend under a given thermal gradient. However, as array sizes or thermal gradients increase, modeling suggests that passive methods can reach a practical limit. Furthermore, a passive structure may result in a single shape for a given set of conditions, when the desired shape, flat or otherwise, may be different at that set of conditions.

Figure 12:
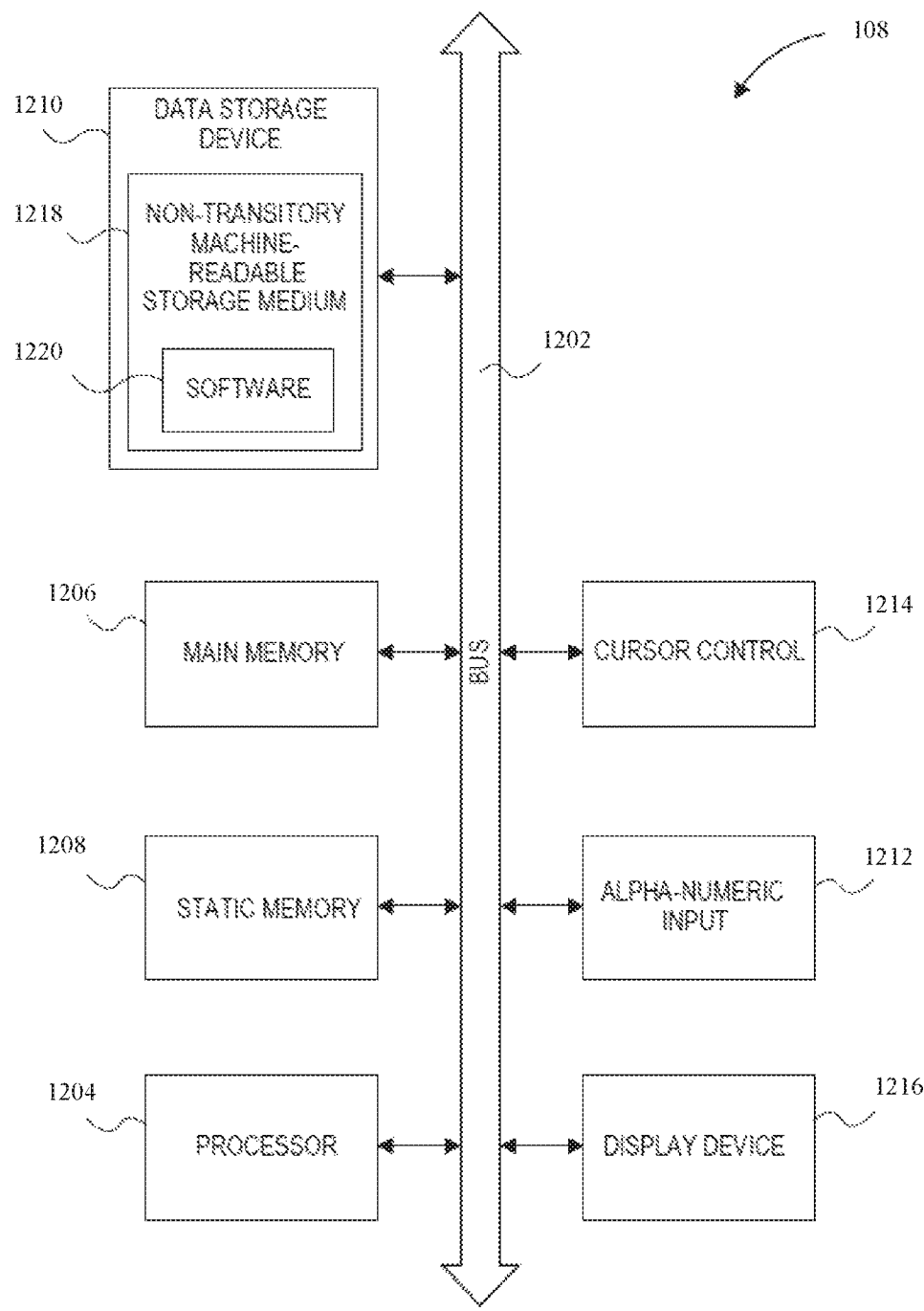
FIG. 12 is a schematic illustration of a computer system in accordance with an embodiment.

Referring to FIG. 12, a schematic illustration of a computer system is shown that may be used in accordance with an embodiment. Portions of embodiments are comprised of or controlled by non-transitory machine-readable and machine-executable instructions that reside, for example, in machine-usable media of a host computer 108. Host computer 108 is exemplary, and embodiments may operate on or within, or be controlled by a number of different computer systems including general purpose networked computer systems, embedded computer systems, routers, switches, server devices, client devices, various intermediate devices/nodes, stand-alone computer systems, and the like.

Host computer 108 of FIG. 12 includes an address/data bus 1202 for communicating information, and a central processor 1204 coupled to bus 1202 for processing information and instructions. Host computer 108 also includes data storage features such as a computer usable volatile memory, e.g. random access memory (RAM) 1206, coupled to bus 1202 for storing information and instructions for central processor 1204, computer usable non-volatile memory 1208, e.g. read only memory (ROM), coupled to bus 1202 for storing static information and instructions for the central processor 1204, and a data storage device 1210 (e.g., a magnetic or optical disk and disk drive) coupled to bus 1202 for storing information and instructions. Host computer 108 of the present embodiment also includes an optional alphanumeric input device 1212 including alphanumeric and function keys coupled to bus 1202 for communicating information and command selections to central processor 1204. Host computer 108 also optionally includes an optional cursor control 1214 device coupled to bus 1202 for communicating user input information and command selections to central processor 1204. Host computer 108 of the present embodiment also includes an optional display device 1216 coupled to bus 1202 for displaying information.

The data storage device 1210 may include a non-transitory machine-readable storage medium 1218 on which is stored one or more sets of instructions (e.g. software 1220) embodying any one or more of the methodologies or operations described herein. For example, software 1220 may include instructions, which when executed by processor 1204, cause host computer 108 to control mass transfer system 100 as described above for performing pick and place and active shape control operations. Software 1220 may also reside, completely or at least partially, within the volatile memory, non-volatile memory 1208, and/or within processor 1204 during execution thereof by host computer 108, volatile memory 1206, non-volatile memory 1208, and processor 1204 also constituting non-transitory machine-readable storage media. The host computer 108 may additionally include a network interface, for example, for transmitting or receiving the instructions over a network.

Software 1220 may also reside, completely or at least partially on the printed circuit board (PCB) 710 installed on the mass transfer system 100, or more specifically on the articulating transfer head assembly.

The present disclosure also relates to a system for performing the operations described herein. This system and subsystems may be specially constructed for the required purposes. A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more memories (e.g., one or more flash memories, random access memories (static, dynamic or other), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

The preceding Detailed Descriptions are presented in terms of algorithms. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "analyzing," "providing," "determining," "measuring," "comparing," "equating," "fitting" or the like, refer to the action and processes of a device, or similar electronic computing device, that manipulates and transforms data represented as physical (electronic) quantities within the device's registers and memories into other data similarly represented as physical quantities within the device memories or registers or other such information storage, or transmission.

In utilizing the various aspects of the embodiments, it would become apparent to one skilled in the art that combinations or variations of the above embodiments are possible for actively controlling the shape of a MEMS device. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A support substrate with active shape control comprising:
    a base substrate including a front side and a back side, and a pivot platform connected to a support structure;
    a heater element on the front side of the base substrate pivot platform;
    a plurality of electrodes on the front side of the base substrate pivot platform; and
    a piezoelectric actuator element bonded to the back side of the base substrate pivot platform to control a curvature of the base substrate.

2. The support substrate of claim 1, wherein the pivot platform is laterally surrounded the support structure.

3. The support substrate of claim 1, further comprising a mirror pattern on a back side of the piezoelectric actuator element.

4. The support substrate of claim 1, wherein the plurality of electrodes are covered with a dielectric material.

5. The support substrate of claim 1, further comprising a strain gage to sense bending strain that is proportional to a curvature of the base substrate.

6. The support substrate of claim 5, further comprising a temperature sensor adjacent the strain gage.

7. The support substrate of claim 5, wherein the strain gage is bonded to the piezoelectric actuator element, bonded to the base substrate, or integrated into the base substrate.

8. A mass transfer tool comprising:
    an articulating transfer head assembly including a mounting surface;
    a support substrate that is releasably attachable with the mounting surface, wherein the support substrate comprises:
        a base substrate including a front side and a back side, and a pivot platform connected to a support structure;
        a heater element on the front side of the base substrate pivot platform; and
        a piezoelectric actuator element bonded to the back side of the base substrate pivot platform to control a curvature of the base substrate.

9. The mass transfer tool of claim 8, wherein the articulating transfer head assembly further comprises a plurality of displacement sensors arranged over the support substrate to measure displacement of the support substrate at a plurality of locations.

10. The mass transfer tool of claim 9, wherein one or more of the displacement sensors is arranged directly over the piezoelectric actuator element.

11. The mass transfer tool of claim 8, wherein the support substrate further comprises a strain gage to sense bending strain that is proportional to a curvature of the base substrate.

12. The mass transfer tool of claim 11, wherein the strain gage is bonded to the piezoelectric actuator element, bonded to the base substrate, or integrated into the base substrate.

13. The mass transfer tool of claim 8, wherein the articulating transfer head assembly further comprises a plurality of displacement sensors arranged over the support substrate to measure displacement of the support substrate at a plurality of locations, wherein the plurality of displacement sensors includes three or more displacement sensors arranged at a common radius from an axis of symmetry of the pivot platform and an additional displacement sensor located inside the common radius.

14. The mass transfer tool of claim 13, wherein the additional displacement sensor is located near the axis of symmetry of the pivot platform.

15. The mass transfer tool of claim 8, wherein the articulating transfer head assembly further comprises a plurality of displacement sensors arranged over the support substrate to measure displacement of the support substrate at a plurality of locations, wherein the plurality of displacement sensors are arranged at two different radii from an axis of symmetry of the pivot platform.

16. The mass transfer tool of claim 8, wherein the piezoelectric actuator element is substantially symmetric with the pivot platform.

17. The mass transfer tool of claim 8, further comprising a flex circuit attached to the front side of the base substrate.

18. The mass transfer tool of claim 8, further comprising:
    a plurality of displacement sensors arranged over the support substrate to measure displacement of the support substrate at a plurality of locations; and
    a mirror pattern on a back side of the piezoelectric actuator element, wherein the mirror pattern is vertically aligned with one or more of the plurality of displacement sensors.

19. The mass transfer tool of claim 8, further comprising:
    a plurality of displacement sensors arranged over the support substrate to measure displacement of the support substrate at a plurality of locations; and
    a mirror pattern on the back side of the base substrate, wherein the mirror pattern is vertically aligned with one or more of the plurality of displacement sensors.

20. The support substrate of claim 1, wherein the piezoelectric actuator element is substantially symmetric with the pivot platform.

* * * * *